(12) United States Patent
Tominaga et al.

(10) Patent No.: US 8,994,055 B2
(45) Date of Patent: Mar. 31, 2015

(54) LIGHT SOURCE AND PROJECTION-TYPE DISPLAY DEVICE (75) Inventors: Shin Tominaga, Tokyo (JP); Masao Imai, Tokyo (JP); Masanao Natsumeda, Tokyo (JP)

(73) Assignee: NEC Corporation, Tokyo (JP)

( * ) Notice: Subject to any disclaimer, the term of this patent is extended or adjusted under 35 U.S.C. 154(b) by 238 days.

(21) Appl. No.: 13/808,498

(22) PCT Filed: Jun. 30, 2011

(86) PCT No.: PCT/JP2011/065091
§ 371 (c)(1),
(2), (4) Date: Jan. 4, 2013

(87) PCT Pub. No.: WO2012/026211
PCT Pub. Date: Mar. 1, 2012

(65) Prior Publication Data
US 2013/0107132 A1 May 2, 2013

(30) Foreign Application Priority Data

Aug. 24, 2010 (JP) ................................ 2010-187149

(51) Int. Cl.
*H01L 33/00* (2010.01)
*H01L 33/46* (2010.01)
(Continued)

(52) U.S. Cl.
CPC ................ *H01L 33/46* (2013.01); *G02B 5/008* (2013.01); *G02B 27/286* (2013.01); *G03B 21/2033* (2013.01); *G03B 21/2073* (2013.01); *H04N 9/3167* (2013.01); *H04N 9/31* (2013.01)
USPC ................. 257/98; 257/86; 257/94; 257/103; 257/95

(58) Field of Classification Search
USPC .................................. 257/94, 95, 98, 86, 103
See application file for complete search history.

(56) References Cited

U.S. PATENT DOCUMENTS

2003/0184989 A1   10/2003   Matsumoto et al.
2007/0181889 A1*  8/2007    Orita ............................... 257/79
(Continued)

FOREIGN PATENT DOCUMENTS

CN   101105552 A    1/2008
JP   2003295183 A   10/2003
(Continued)

OTHER PUBLICATIONS

The international search report for PCT/JP2011/065091 mailed on Oct. 11, 2011.
(Continued)

*Primary Examiner* — Thien F Tran
(74) *Attorney, Agent, or Firm* — Sughrue Mion, PLLC (57) ABSTRACT A light source capable of solving a problem in which the etendue is increased when random polarization is converted into a specific polarization is provided. A relief structure that functions as surface plasmon excitation means for exciting a surface plasmon by a specific polarization component in a polarization direction perpendicular to a first direction in an interface between metal layer 15 and first cover layer 14 in light from emission layer 13 incident on the interface is formed at the interface. The relief structure is periodic in a second direction. Projections 21A of the relief structure are extended along the first direction. A light generation means for generating light having the same polarization component as the particular polarization component from the surface plasmon generated at the interface between metal layer 15 and first cover layer 14 according to the surface plasmon excited by the particular polarization component through the surface plasmon excitation means is formed at the interface between metal layer 15 and second cover layer 16.

26 Claims, 8 Drawing Sheets (51) Int. Cl.
*G02B 5/00* (2006.01)
*G02B 27/28* (2006.01)
*G03B 21/20* (2006.01)
*H04N 9/31* (2006.01)

(56) References Cited

U.S. PATENT DOCUMENTS

| | | |
|---|---|---|
| 2007/0221269 A1 | 9/2007 | Sakai et al. |
| 2008/0013878 A1 | 1/2008 | Fujiwara et al. |
| 2011/0299561 A1* | 12/2011 | Akiyama .................. 372/50.11 |
| 2014/0028012 A1* | 1/2014 | Petiton et al. .................. 283/85 |

FOREIGN PATENT DOCUMENTS

| | | |
|---|---|---|
| JP | 2006313667 A | 11/2006 |
| JP | 2007266095 A | 10/2007 |
| JP | 2008020728 A | 1/2008 |
| JP | 2009239217 A | 10/2009 |

OTHER PUBLICATIONS

Chinese Patent Office Action for CN Application No. 201180039116.0 mailed on Dec. 15, 2014 with English Translation.

* cited by examiner

Fig.13 ered as the product of the light emission area and
LIGHT SOURCE AND PROJECTION-TYPE DISPLAY DEVICE This application is a National Stage Entry of PCT/JP2011/065091 filed Jun. 30, 2011, which claims priority from Japanese Patent Application 2010-187149 filed Aug. 24, 2010, the contents of all of which are incorporated herein by reference, in their entirety.

TECHNICAL FIELD

The present invention relates to a light source and a projection-type display device and, more particularly, to a light source and a projection-type display device using a surface plasmon.

BACKGROUND ART

In recent years, attention has been given to projectors using a light emitting diode (LED) as a light source. A projector of this kind has an LED, an illumination optical system into which light emitted from the LED enters, a modulating element that modulates light from the illumination optical system according to a video signal and that emits the modulated light, and a projection optical system that projects the light from the modulating element onto a screen.

With respect to the above-described projector, there is a demand for using light emitted from a light source as projection light with efficiency in order to increase the brightness of the projected image. Enabling efficient use of light emitted from a light source as projection light requires setting the etendue obtained as the product of the light emission area and the radiation angle of the light source equal to or smaller than the product of the light receiving area of the modulating element and the acceptance angle determined by the F-number of the illumination optical system.

In some cases, in the above-described projector, an element having a polarization dependence, e.g., a liquid crystal panel is used as the modulating element. In such cases, since light emitted from the LED is randomly polarized light, efficiently using light emitted from a light source as projection light requires converting random polarization into a specific polarization.

For a technique to convert random polarization into a specific polarization, a planar illumination device described in Patent Literature 1 exists. The planar illumination device has a light guide plate, a stepped microprism provided below the light guide plate, a polarization separating film provided on the light guide plate, and an upper cover provided on the polarization separating film. The polarization separating film has a structure in which a metal thin film is sandwiched between a first low-refractive-index transparent medium and a second low-refractive-index transparent medium.

In the above-described planar illumination device, light from a light source enters the light guide plate and propagates through the light guide plate while being angle-converted by the microprism. When the light is totally reflected by a first boundary i.e., the boundary between the light guide plate and the first low-refractive-index transparent medium, a surface plasmon is excited at the metal thin film by evanescent waves generated simultaneously with the reflection. When the surface plasmon is excited at the metal thin film, the process reverse to the process of excitation of the surface plasmon occurs at a second boundary i.e., the boundary between the second low-refractive-index transparent medium and the upper cover. Light is generated at the second boundary and emitted through the upper cover.

The light that excites the surface plasmon in the light striking the first boundary is only TM-polarized light having an electric field component parallel to the first boundary. Then the light generated at the second boundary is TM-polarized light, as is the light exciting the surface plasmon, since the light generated at the second boundary is produced by the process reverse to the surface plasmon excitation process. Thus, the planar illumination device can convert random polarization into a specific polarization before emitting the light.

CITATION LIST

Patent Literature

Patent Literature 1: JP2003-295183A

SUMMARY OF INVENTION

Technical Problem

In the planar illumination device described in Patent Literature 1, angle conversion of light is made with the microprism. Therefore light in the light guide plate propagates in various directions and strikes the first boundary in various directions. In this case, surface plasmons propagating in various directions are produced at the metal thin film, and the light generated at the second boundary is also emitted in various directions. As a result, the etendue is increased and the light emitted from the light source cannot be efficiently used as projection light.

An object of the present invention is to provide a light source and a projection-type display device capable of solving the above-described problem in which the etendue is increased at the time of conversion of random polarization into a specific polarization.

Solution to Problem

According to the present invention, there is provided a light source including an emission layer, and a first transparent dielectric layer, a metal layer and a second transparent dielectric layer stacked in this order on the emission layer, wherein a relief structure that functions as surface plasmon excitation means for exciting a surface plasmon by a particular polarization component in a polarization direction perpendicular to a first direction coplanar with an interface between the metal layer and the first transparent dielectric layer in light from the emission layer incident on the interface is formed at the interface, the relief structure being periodic in a second direction perpendicular to the first direction in the interface, respective projections of the relief structure being extended along the first direction, and wherein light generation means for generating light having the same polarization component as the particular polarization component from the surface plasmon generated at the interface between the metal layer and the first transparent dielectric layer according to the surface plasmon excited by the particular polarization component through the surface plasmon excitation means is formed at an interface between the metal layer and the second transparent dielectric layer.

According to the present invention, there is also provided a projection-type display device including the above-described light source, a modulating element that modulates light from the light source according to a video signal and sends out the modulated light, and a projection optical system that projects light sent out from the modulating element.

Advantageous Effect of Invention

According to the present invention, random polarization can be converted into a specific polarization without increasing the etendue.

DESCRIPTION OF EMBODIMENTS

Exemplary embodiments of the present invention will be described with reference to the drawings. In the following description, components having the same functions are indicated by the same reference characters and description of them is omitted in some cases.

[First Exemplary Embodiment]

Figure 1:
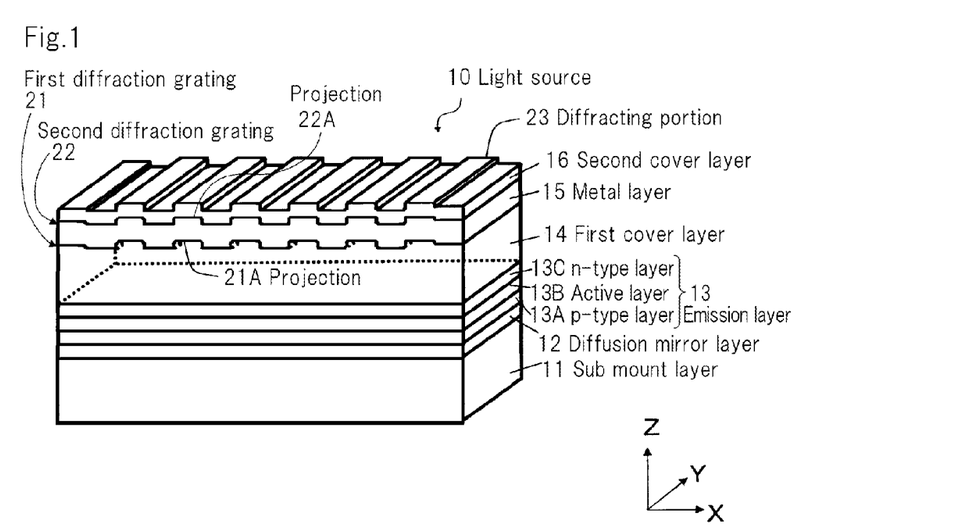
FIG. 1 is a perspective view showing a light source in a first exemplary embodiment of the present invention.

FIG. 1 is a perspective view showing a light source in a first exemplary embodiment of the present invention. Light source 10 has sub-mount layer 11, diffusion mirror layer 12, emission layer 13, first cover layer 14, metal layer 15 and second cover layer 16 stacked in this order.

Because the thickness in each layer in the actual light source is extremely small and the layers vary largely in thickness, it is difficult to show the layers in accurate proportions. In FIG. 1, therefore, the layers are schematically illustrated without being shown in the actual proportions. Also, referring to FIG. 1, a plane parallel to the upper surface of emission layer 13 is assumed as the XY-plane and the direction perpendicular to the XY-plane is assumed as the Z-direction. Then linearly polarized light having a polarization direction perpendicular to the Y-direction is assumed to be TM-polarized light, while linearly polarized light having a polarization direction parallel to the Y-direction is assumed to be TE-polarized light.

Diffusion mirror layer 12 diffuses and reflects light incident thereon.

Emission layer 13 emits light of a predetermined wavelength. More specifically, emission layer 13 has p-type layer 13A, which is a p-type semiconductor layer, active layer 13B, and n-type semiconductor layer 13C, which is an n-type semiconductor layer, stacked in this order from the lowest position. When a voltage is applied between p-type layer 13A and n-type layer 13C from an external power supply (not illustrated) to cause a current to flow therebetween, light is generated in active layer 13B according to the current. Light generated in active layer 13B is randomly polarized light.

First cover layer 14 is a first transparent dielectric layer formed of a transparent dielectric. Light from emission layer 13 propagates in first cover layer 14. Examples of the transparent dielectric as the material forming first cover layer 14 are a transparent acrylic resin such as polymethyl methacrylate resin (PMMA) and glass. In the following, glass is assumed to be used as the transparent dielectric.

Metal layer 15 is formed of a metal such as Ag. Metal layer 15 is provided on and in contact with first cover layer 14.

The interface between first cover layer 14 and metal layer 15 forms first diffraction grating 21 that diffracts light. First diffraction grating 21 is formed of a relief structure periodic in a unidimensional direction (hereinafter referred to as X-direction). More specifically, first diffraction grating 21 is formed by periodically arranging in the X-direction (second direction) a plurality of projections 21A extended in the Y-direction (first direction). First diffraction grating 21 functions as surface plasmon excitation means for exciting a surface plasmon at the interface between first cover layer 14 and metal layer 15 by TM polarized light incident on metal layer 15 at a predetermined incidence angle in randomly polarized light propagating in first cover layer 14.

Second cover layer 16 is formed of a material having the same dielectric constant as that of first cover layer 14. Second cover layer 16 is provided on and in contact with metal layer 15.

The interface between metal layer 15 and second cover layer 14 forms second diffraction grating 22. Second diffraction grating 22 has the same structure as that of first diffraction grating 21. That is, second diffraction grating 22 has projections 22A having the same shape as that of projections 21A of first diffraction grating 21. A plurality of projections 22A are arranged in the X-direction with the same period as that with which projections 21A are arranged. Second diffraction grating 22 functions as light generation means for generating light from the surface plasmon excited by first diffraction grating 21.

The upper surface of second cover layer 16 is a light exit in light source 10. Diffracting portion 23 is formed in the upper surface. Light generated at second diffraction grating 22 exits from diffracting portion 23 while being diffracted by diffracting portion 23 in a predetermined direction. Diffracting portion 23 is formed by periodically arranging in the X-direction a plurality of structural members (e.g., projections) extended in the Y-direction, as is each of first diffraction grating 21 and second diffraction grating 22.

The principle of excitation of a surface plasmon and generation of light from the surface plasmon will be described next in detail.

A surface plasmon is a longitudinal charge density wave of a concentration of electrons propagating along the interface between a metal and a dielectric. The dispersion relation between the wavenumber and the angular frequency of the surface plasmon is determined from the dielectric constants of the metal and the dielectric at the interface. When the dispersion relation in the surface plasmon coincides with the dispersion relation in light propagating in the dielectric, that is, when the wavenumber of the light in the dielectric is equal to the wavenumber of the surface plasmon, the surface plasmon is excited by the light. In ordinary cases, however, when the interface between the metal and the dielectric is flat, the dispersion relation in a surface plasmon and the dispersion relation in light in the dielectric do not coincide with each other. For this reason, a surface plasmon cannot be excited by only causing light to enter the metal from the dielectric.

Thus, enabling excitation of a surface plasmon requires changing the dispersion relation in the light in the dielectric so that the dispersion relation in the surface plasmon and the dispersion relation in the light in the dielectric coincide with each other.

As a method of exciting a surface plasmon by changing the dispersion relation in light, a grating coupling method in which a diffraction grating is provided at the interface between a metal and a dielectric is known. According to the grating coupling method, when light is incident on the diffraction grating at a predetermined incidence angle, the dispersion relation in light diffracted by the diffraction grating and the dispersion relation in a surface plasmon coincide with each other and the surface plasmon is excited at the interface between the dielectric and the metal.

Also, due to the fact that a surface plasmon is a longitudinal charge density wave, incident light that excites a surface plasmon propagating in a particular direction is only linearly polarized light having an electric field component parallel to the particular direction. Therefore, the provision of a relief structure periodic in the X-direction at the interface between first cover layer 14 and metal layer 15, as shown is FIG. 1, enables limiting light by which a surface plasmon can be excited at the interface between first cover layer 14 and metal layer 15 to linearly polarized light having an electric field component in the X-direction and a predetermined incidence angle from first diffraction grating 21.

If metal layer 15 is sufficiently reduced in thickness to about 100 nm or less, exchanges of surface plasmon energy occur on both sides of metal layer 15 and the same surface plasmon as that excited on the first diffraction grating 21 side is also generated on the second diffraction grating 22 side. When a surface plasmon is excited as described above, therefore, the process that is reverse to the process of excitation of the surface plasmon by first diffraction grating 21 occurs at second diffraction grating 22 to emit light from second diffraction grating 22. This is because of the coincidence between the dispersion relation in light in first cover layer 14 and the dispersion relation in light in second cover layer 16, which is due to the state where the first diffraction grating and the second diffraction grating have relief structure structures identical to each other and first cover layer 14 and second cover layer 16 have dielectric constants equal to each other.

Since the light emergent from second diffraction grating 22 is the result of the process that is reverse to the process by which the surface plasmon is excited, it is the same as the light that has excited the surface plasmon, i.e., TM-polarized light having an electric field component in the X-direction. Also, the angle of emergence of the light emergent from second diffraction grating 22 is the same as the angle of incidence of the light exciting the surface plasmon.

Thus, in the present exemplary embodiment, first diffraction grating 21 and second diffraction grating 22 are made identical to each other in optical construction to enable the same light as TM-polarized light incident on first diffraction grating 21 to exit from second diffraction grating 22.

Also in a case where light having propagation components in directions other than the X-direction is incident on first diffraction grating 21, a surface plasmon is excited by a polarization component parallel to the X-direction if the angle of incidence of projection light in projection of the incident light onto the ZX-plane satisfies the surface plasmon excitation direction. Also in this case, however, the direction of propagation of the surface plasmon is limited to the X-direction. Therefore light exiting from second diffraction grating 22 is TM-polarized light having an electric field component in the X-direction.

The operation of light source 10 will be described next.

Figure 2:
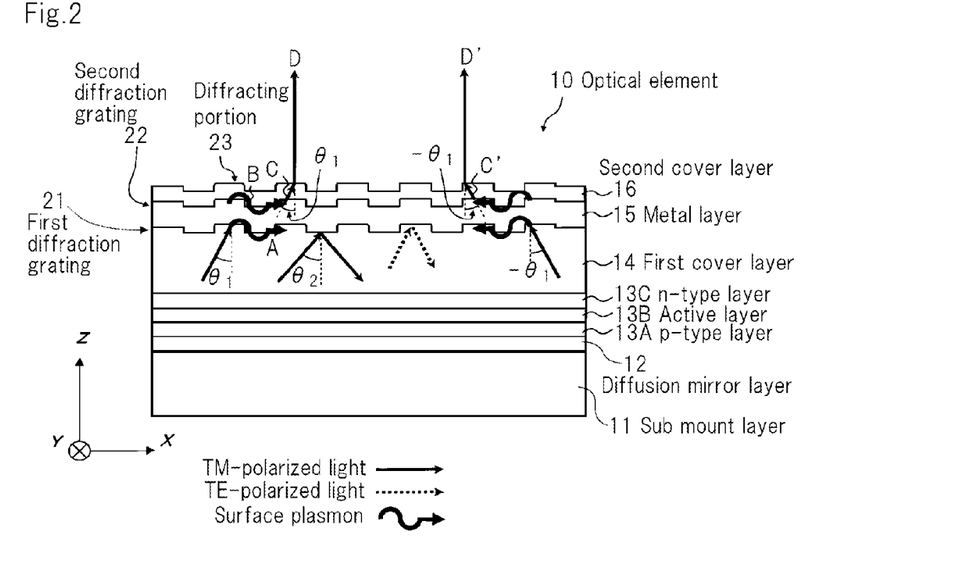
FIG. 2 is a diagram for explaining the operation of the light source in the first exemplary embodiment of the present invention.

FIG. 2 is a diagram for explaining the operation of light source 10, showing a section of light source 10 taken along the XZ-plane.

When a voltage is applied between p-type layer 13A and n-type layer 13C from the external power supply to cause a current to flow therebetween, randomly polarized light is generated in active layer 13B according to the current. Part of the randomly polarized light generated in active layer 13B directly enters first cover layer 14, and the remaining part of the randomly polarized light is diffused and reflected by diffusion mirror layer 12 to enter first cover layer 14.

TM-polarized light incident on metal layer 15 at an angle θ1 satisfying a surface plasmon excitation condition in the randomly polarized light incident on first cover layer 14 excites a surface plasmon along metal layer 15 through first diffraction grating 21. (See arrow A in the figure.) The same surface plasmon as that generated as described above is then generated at second diffraction grating 22 (see arrow B in the figure). Light is generated in second cover layer 16 by this surface plasmon. The light thereby generated is the same TM-polarized light as the light that has excited the surface plasmon at the interface between first cover layer 14 and metal layer 15, and exits at the same angle θ1 as the angle of incidence of that light (see arrow C in the figure).

On the other hand, light that does not satisfy surface plasmon excitation conditions (e.g., TE-polarized light and TM-polarized light incident on metal layer 15 at an incidence angle θ2 different from incidence angle θ1) in the randomly polarized light incident on first cover layer 14 is only reflected or diffracted at first diffraction grating 21 and excites no surface plasmon. This light is diffused and reflected by diffusion mirror 12 to be again incident on metal layer 15, with the direction of polarization and the incidence angle changed. When the light becomes TM-polarized light incident on metal layer 15 at an incidence angle of θ1 after being repeatedly reflected in such a way, it excites a surface plasmon.

There are two cases of TM-polarized light exciting surface plasmons: one in which TM-polarized light enters metal layer 15 at incidence angle θ1 after propagating in the +X direction while repeating multipath reflection along the ZX-plane, and one in which TM-polarized light enters metal layer 15 at incidence angle −θ1 after propagating in the −X direction while repeating multipath reflection along the ZX-plane. Correspondingly, rays of TM-polarized light generated at second cover layer 16 exit along two directions. These rays of light generated to exit in different directions are diffracted by diffracting portion 23 formed in the exit surface of second cover layer 16 to exit in predetermined directions (directions perpendicular to the exit surface in the present exemplary embodiment; see arrows D and D' in the figure).

Diffracting portion 23 in the present exemplary embodiment has the same structure as those of first diffraction grating 21 and second diffraction grating 22. This is for diffracting in predetermined directions the light exiting at two emergence angles θ1 and −θ1 from second diffraction grating 22. Therefore, it is not necessary that diffracting portion 23 have the same structure as those of first diffraction grating 21 and second diffraction grating 22, as long as the structural members extended in the Y-direction are periodically arranged in the X-direction. The shapes of the structural members and the intervals at which the structural members are disposed can be changed as appropriate according to the angle of incidence on diffracting portion 23 and the desired angle of emergence.

In the diffraction grating for exciting a surface plasmon, a parameter with which to change the dispersion relation in light is the lattice constant (pitch). Therefore the construction of first diffraction grating 21 is not limited to the construction shown in FIG. 1. That is, the sectional shape of projections 21A in first diffraction grating 21 can be changed as appropriate.

Figure 3:
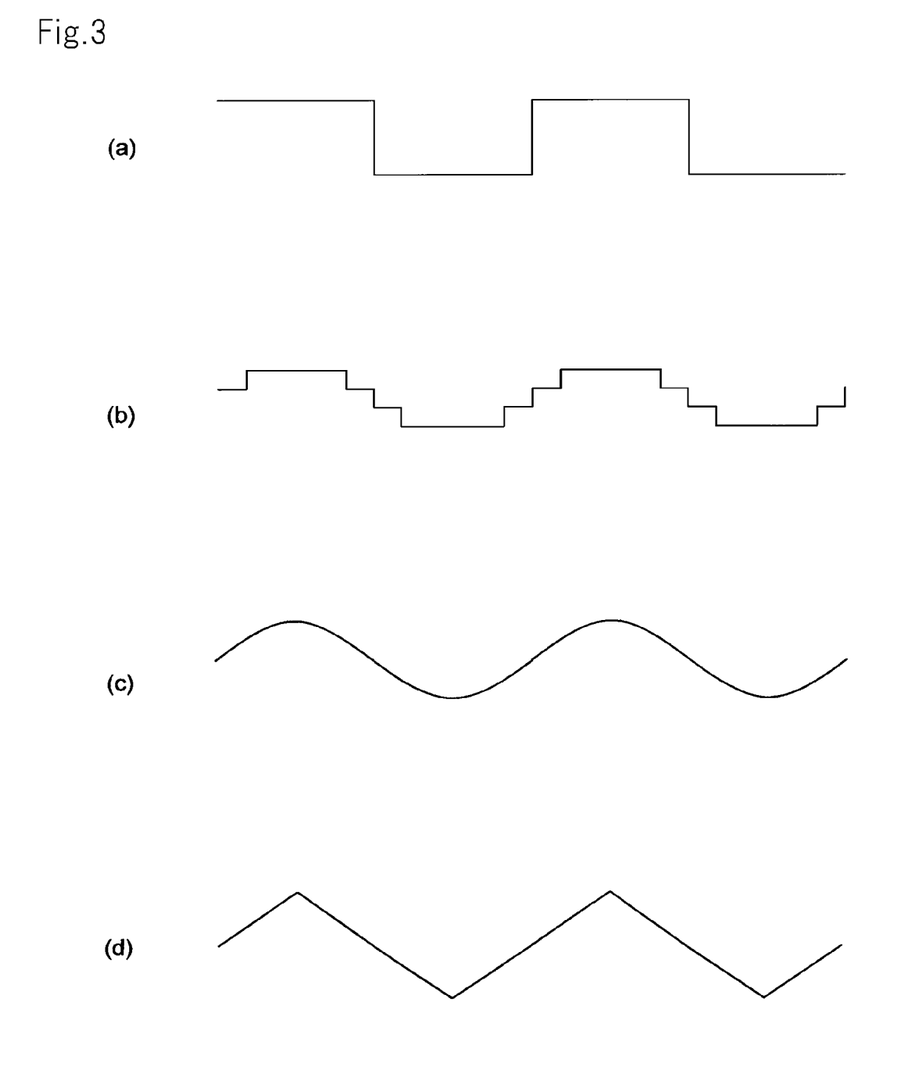
FIG. 3 is a sectional view showing examples of the shape of a first diffraction grating.

FIG. 3 is a sectional view showing an example of the shape of first diffraction grating 21, i.e., a sectional shape of first diffraction grating 21 taken along the XZ-plane. As shown in FIG. 3, examples of the sectional shape of first diffraction grating 21 are the shape of rectangular waves (see FIG. 3(a)), the shape of stepped waves (see FIG. 3(b)), the shape of sinusoidal waves (see FIG. 3(c)), the shape of isosceles-triangle waves (see FIG. 3(d)) and the like. Such sectional shapes are bilaterally symmetrical about a line passing through the vertex of one of projections 21A and perpendicular to the Y-direction (a line parallel to the Z-direction).

In FIGS. 1 and 2, first diffraction grating 21 having the sectional shape corresponding to the shape of rectangular waves shown in FIG. 3(a) is illustrated. Since the structure of the second diffraction grating is the same as that of first diffraction grating 21, the sectional shape of the second diffraction grating is also the same as that of first diffraction grating 21.

When a surface plasmon is excited by diffracted light of a second or higher order, a plurality of modes occur in the surface plasmon. In this case, rays of light exiting in a plurality of directions corresponding to the modes of the surface plasmon are generated and the angle of radiation of light exiting from light source 10 is increased, so that the etendue of light source 10 is increased. Thus, the efficiency of use of light exiting from light source 10 can be improved by improving the efficiency of diffraction of primary diffracted light.

The efficiency of diffraction of primary diffracted light with first diffraction grating 21 having a section corresponding to the shape of stepped waves shown in FIG. 3(b) can be improved by increasing the number of steps in the shape of stepped waves. For example, when the number of steps is 4, the efficiency of diffraction of primary diffracted light is about 81%. First diffraction grating 21 having a sectional shape corresponding to the shape of sinusoidal waves shown in FIG. 3(c) can also be regarded as a diffraction grating in the form of stepped waves having an infinite number of steps. The theoretical efficiency of diffraction of primary diffracted light with this diffraction grating is 100%. From the viewpoint of efficiency of use of light exiting from light source 10, it is desirable that first diffraction grating 21 have a section corresponding to the shape of sinusoidal waves.

The pitch of first diffraction grating 21 will next be described.

As described above, the dispersion relation in a surface plasmon is determined according to the dielectric constants of the dielectric and the metal sandwiching the interface at which the surface plasmon is generated. The excitation conditions with respect to the diffraction grating for exciting the surface plasmon and the angle of incidence of light exciting the surface plasmon vary depending on the kinds and properties of the metal and the dielectric. It is known that the excitation conditions and the incidence angle vary largely depending on the kind and properties of the metal in particular.

In the following, it is assumed that glass is used as the dielectric, and Ag having a plasma frequency higher than the frequency ranges of red light, green light and blue light and capable of reflecting, with high efficiency, light other than light that excites a surface plasmon is used as the metal.

Figure 4:
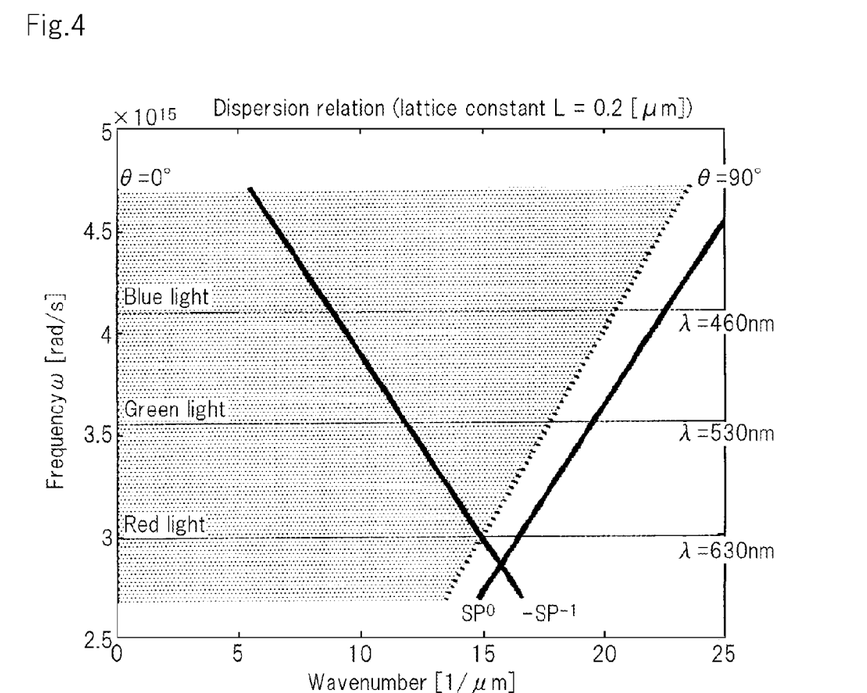
FIG. 4 is a diagram showing an example of dispersion relations in a surface plasmon and light.
Figure 5:
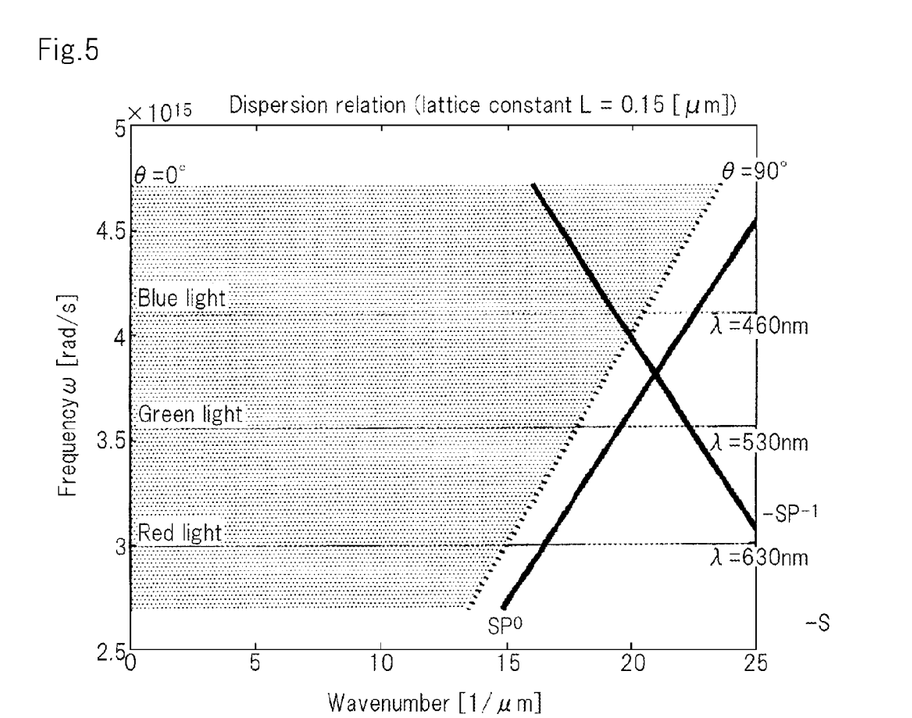
FIG. 5 is a diagram showing another example of dispersion relations in the surface plasmon and light.

FIGS. 4 and 5 are diagrams showing dispersion relations in a surface plasmon and light. In FIGS. 4 and 5, the abscissa represents the wavenumber and the ordinate represents the frequency. Also, frequencies corresponding to red light (wavelength: 630 nm), green light (wavelength: 530 nm) and blue light (wavelength: 450 nm) are respectively shown.

Shaded portions in FIGS. 4 and 5 indicate ranges in which the dispersion relation in light propagating in the X-direction in first cover 14 can exist when the light is incident at an incidence angle of $0°<\theta1<90°$ on metal layer 15. The solid line (thick line $-SP^{-1}$) represents the dispersion relation in a surface plasmon excited by primary diffracted light caused by first diffraction grating 21. Accordingly, if a region in which this solid line and the shaded portion intersect each other exists, the surface plasmon can be excited from the primary diffracted light by the energy of light corresponding to the region.

FIG. 4 is a diagram showing the dispersion relations in a surface plasmon and light when the lattice constant L of first diffraction grating 21 is set to 0.2 μm.

In FIG. 4, the solid line intersects the shaded portion in all the frequency regions respectively corresponding to red light, green light and blue light. That is, when the pitch of first diffraction grating 21 is 0.2 μm, the surface plasmon can be excited from each of primary diffracted lights of red light, green light and blue light.

FIG. 5 is a diagram showing the dispersion relations in the surface plasmon and light when the lattice constant L of first diffraction grating 21 is set to 0.15 μm.

In FIG. 5, the solid line intersects the shaded portion only in the frequency region corresponding to blue light. That is, when the pitch of first diffraction grating 21 is 0.15 μm, the surface plasmon can be excited from primary diffracted light of blue light.

Thus, the pitch of first diffraction grating 21 is set to 0.2 μm or more with respect to red light and green light or to 0.15 μm or more with respect to blue light to enable excitation of the surface plasmon using primary diffracted light.

If the pitch of first diffraction grating 21 is increased, excitation of the surface plasmon by diffraction light of a second or higher order is also caused. If the pitch is further increased, the surface plasmon is excited only by diffraction light of a second or higher order and the surface plasmon cannot be excited by the primary diffracted light.

Therefore, the pitch of first diffraction grating 21 is, more preferably, within a range in which the surface plasmon can be excited by using primary diffracted light, i.e., $0.2 \mu m \leq L \leq 4.2 \mu m$ if the incident light is red light, $0.2 \mu m \leq L \leq 3.5 \mu m$ if the incident light is green light, and $0.15 \mu m \leq L \leq 3.0 \mu m$ if the incident light is blue light. Most preferably, the pitch of first diffraction grating 21 is within a range in which the surface plasmon can be excited by using only primary diffracted light, i.e., $0.2 \mu m \leq L \leq 0.35 \mu m$ if the incident light is red light, $0.2 \mu m \leq L \leq 0.3 \mu m$ if the incident light is green light, and $0.15 \mu m \leq L \leq 0.25 \mu m$ if the incident light is blue light.

In a case where a pitch used as the pitch of first diffraction grating 21 is such that the surface plasmon is excited by diffracted light of a second or higher order, it is preferable to set the efficiency of diffraction of primary diffracted light 100% or close to 100% by making the sectional shape of first diffraction grating 21 the same as or close to the shape of sinusoidal waves.

Also, the relationship between the pitch L of first diffraction grating 21 and the angle θ1 of incidence of the light exciting the surface plasmon is θ1=6° when L=0.35 μm with respect to red light, θ1=4° when L=0.3 μm with respect to green light, and ♭1=7° when L=0.25 μm with respect to blue light.

Metal layer 15 may be formed of Al or Au instead of being formed of Ag. In a case where metal layer 15 is formed of Al, the pitch of first diffraction grating 21 capable of exciting the surface plasmon only by primary diffracted light is 0.25 μm≤L≤0.4 μm if the incident light is red light, 0.2 μm≤L≤0.3 μm if the incident light is green light, and 0.2 μm≤L≤0.3 μm if the incident light is blue light. In a case where metal layer 15 is formed of Au, the pitch of first diffraction grating 21 capable of exciting the surface plasmon only by primary diffracted light is 0.2 μm≤L≤0.35 μm if the incident light is red light, 0.2 μm≤L≤0.3 μm if the incident light is green light, and 0.15 μm≤L≤0.25 μm if the incident light is blue light.

The dispersion relations in the surface plasmon and light used in the above description are based on a grating coupling method on the ZX-plane. That is, the described dispersion relations are the results of calculation of the dispersion relations in the surface plasmon and light parallel to the X-direction at the interface between first cover 14 and metal layer 15 when the intervals at which projections 21A are disposed (the pitch of first grating 21) are changed in first diffraction grating 21 shown in FIG. 2. The dielectric constant of metal layer 15 is assumed to be set in accordance with the Drude-Lorentz model.

A projector having light source 10 will be described next.

Figure 6:
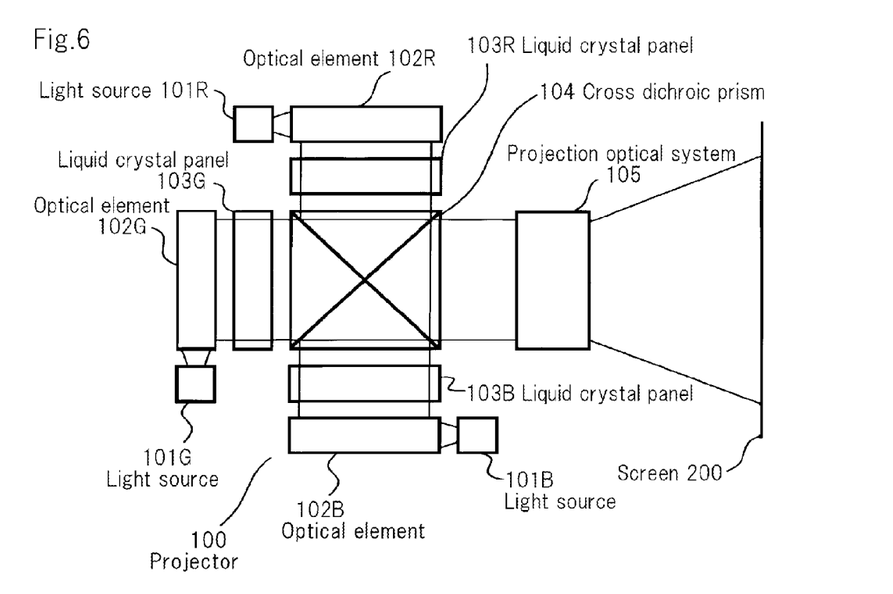
FIG. 6 is an arrangement diagram showing an example of the construction of a projector according to the first exemplary embodiment of the present invention.

FIG. 6 is an arrangement diagram showing an example of the construction of a projector in the present exemplary embodiment. Referring to FIG. 6, projector 100 has light sources 101R, 101G, and 101B, optical elements 102R, 102G, and 102B, liquid crystal panels 103R, 103G, and 103B, cross dichroic prism 104 and projection optical system 105.

Each of light sources 101R, 101G, and 101B has the same structure as that of light source 10 shown in FIG. 1. Light sources 101R, 101G, and 101B are assumed to respectively generate lights differing in wavelength from each other. With respect to the following description, it is assumed that light source 101R emits red light, light source 101G emits green light, and light source 101B emits blue light.

Optical elements 102R, 102G, and 102B lead lights of the respective colors from light sources 101R, 101G, and 101B to liquid crystal panels 103R, 103G, and 103B, respectively, to cause the lights to enter these panels.

Liquid crystal panels 103R, 103G, and 103B are spatial optical modulating elements that modulate the color lights having entered the panels according to a video signal and send out the modulated color lights.

Cross dichroic prism 104 combines the modulated lights exiting from liquid crystal panels 103R, 103G, and 103B and sends out the combined light.

Projection optical system 105 projects onto screen 200 the combined light exiting from cross dichroic prism 104 to display an image on screen 200 according to the video signal.

Figure 7:
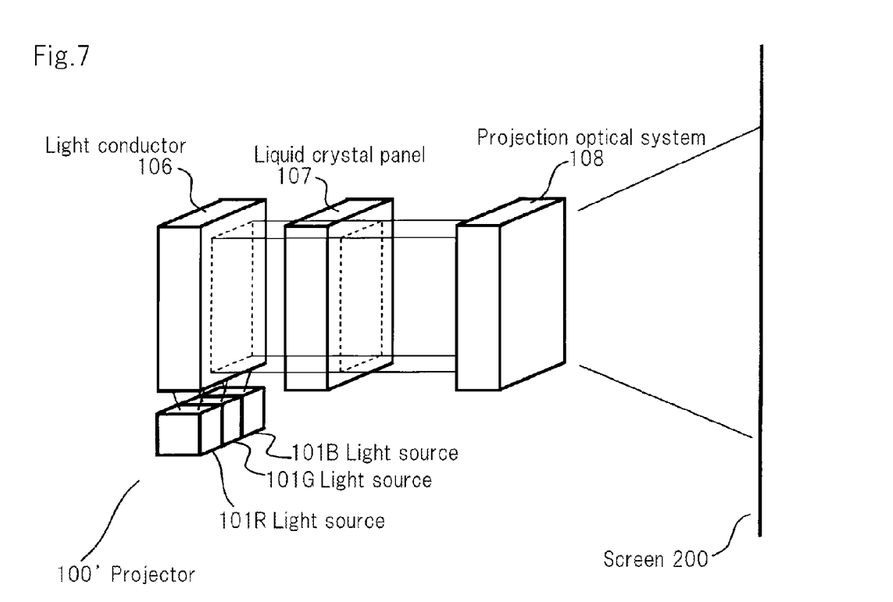
FIG. 7 is an arrangement diagram showing another example of the construction of the projector according to the first exemplary embodiment of the present invention.

FIG. 7 shows another example of the construction of the projector in the present exemplary embodiment. Referring to FIG. 7, projector 100' has light sources 101R, 101G, and 101B, light conductor 106, liquid crystal panel 107 and projection optical system 108.

Light conductor 106 combines color lights from light sources 101R, 101G, and 101B and sends the combined light to liquid crystal panel 107.

Liquid crystal panel 107 is a spatial optical modulating element that modulates according to a video signal the combined light having entered the panel and sends out the modulated combined light.

Projection optical system 108 projects onto screen 200 the modulated light exiting from liquid crystal panel 107 to display an image on screen 200 according to the video signal.

While the liquid crystal panel is used as a spatial optical modulating element as shown in FIGS. 6 and 7, the modulating element, not limited to the liquid crystal panel, can be changed as appropriate. For example, in the projector shown in FIG. 7, a digital micromirror device (DMD) may be used in place of liquid crystal panel 107.

In the present exemplary embodiment, as described above, light source 10 has emission layer 13 and first cover layer 14, metal layer 15 and second cover layer 16 stacked in this order on emission layer 13. A relief structure periodic in the X-direction is formed at the interface between metal layer 15 and first cover layer 14. The dielectric constant of first cover layer 15 and the dielectric constant of second cover layer 16 are equal to each other.

Since the interface between metal layer 15 and first cover layer 14 has a relief structure periodic in the X-direction, light capable of exciting a surface plasmon at the interface between first cover layer 14 and metal layer 15 can be limited to light having an electric field component in the X-direction and having a predetermined angle of incidence on first diffraction grating 21. Also, since first cover layer 14 and second cover layer 15 have dielectric constants equal to each other, the process that is reverse the process of excitation of the surface plasmon by first diffraction grating 21 occurs to emit from second cover layer 16 the same light as the light exciting the surface plasmon, i.e., TM-polarized light having an electric field component in the X-direction and having an emergence angle equal to the incidence angle of the light exciting the surface plasmon. Thus, uniformity in emergence angles can be achieved and, therefore, randomly polarized light can be converted into a particular polarization without increasing the etendue.

[Second Exemplary Embodiment]

Figure 8:
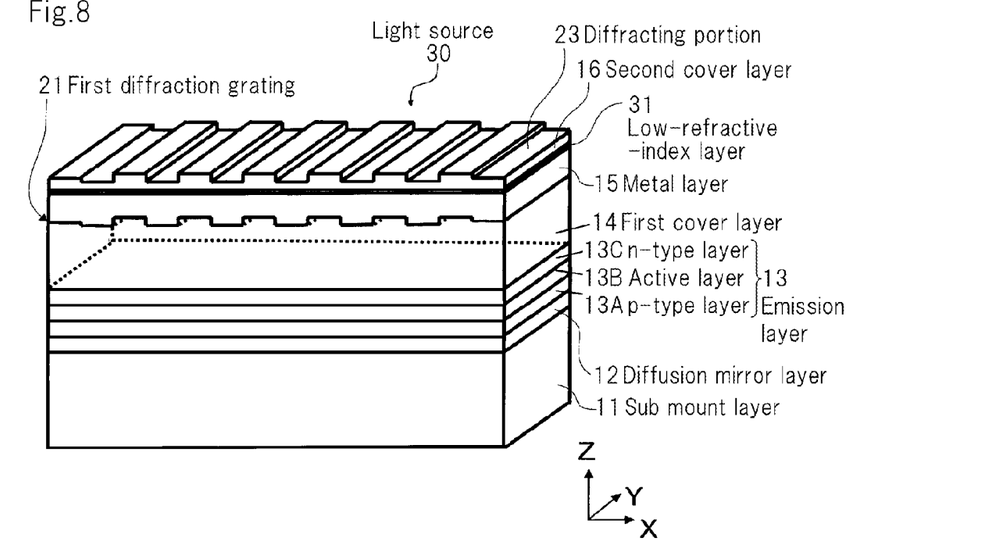
FIG. 8 is a perspective view showing a light source in a second exemplary embodiment of the present invention.

FIG. 8 is a perspective view schematically showing a light source in a second exemplary embodiment of the present invention. Light source 30 shown in FIG. 8 includes a modification of the construction of the light generation means in light source 10 shown in FIG. 1. More specifically, light source 30 differs from light source 10 in that low-refractive-index layer 31 is provided in place of second diffraction grating 22 between metal layer 15 and second cover layer 16. Low-refractive-index layer 31 has a refractive index smaller than that of second cover layer 16.

In the present exemplary embodiment, metal layer 15, second cover layer 16 and low-refractive-index layer 31 constitute the light generation means. In this optical generation means, an Otto configuration is realized and an attenuated total reflection (ATR) method is used as a method in which a surface plasmon and light are coupled with each other and light is generated from the surface plasmon.

According to the ATR method, when light is totally reflected by the interface between a dielectric and a low-refractive-index layer, evanescent light is generated at the interface, and a surface plasmon is excited by the evanescent light at the interface between the low-refractive-index layer and a metal. When a surface plasmon is excited at first diffraction grating 21, therefore, the same surface plasmon as that at first diffraction grating 21 is induced at the interface between metal layer 15 and low-refractive-index layer 31. Light is generated from the surface plasmon through the evanescent light generated at the interface between low-refractive-index layer 31 and second cover layer 16, and exits to second cover layer 16.

As described above, the same effect as that in the first exemplary embodiment is also obtained in the present exemplary embodiment.

[Third Exemplary Embodiment]

Figure 9:
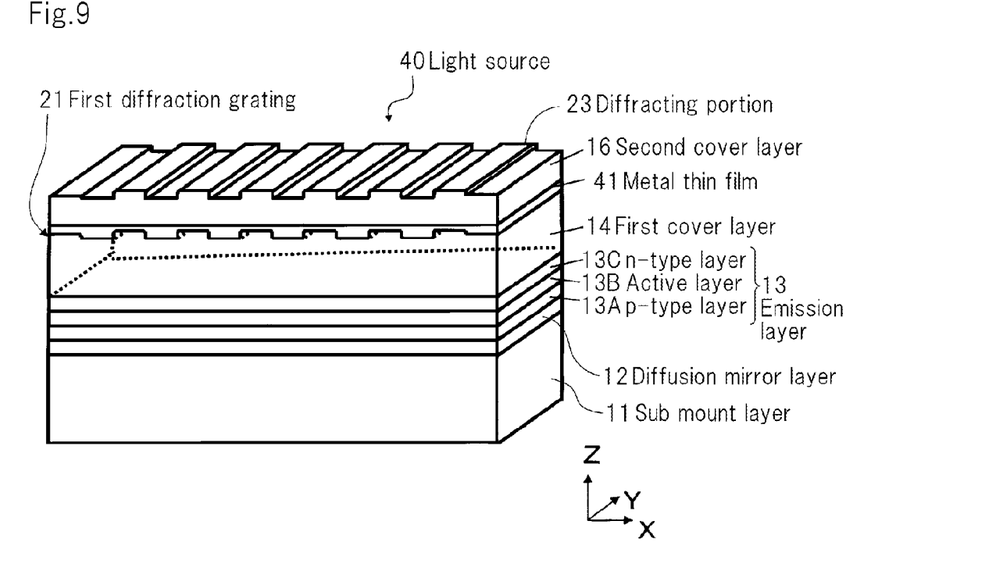
FIG. 9 is a perspective view showing a light source in a third exemplary embodiment of the present invention.

FIG. 9 is a perspective view schematically showing a light source in a third exemplary embodiment of the present invention. Light source 40 shown in FIG. 9 includes a modification of the construction of the light generation means in light source 10 shown in FIG. 1. More specifically, light source 40 differs from light source 10 in that metal layer 41 is provided in place of metal layer 15. Second cover layer 16 has a refractive index smaller than that of first cover layer 14. First cover layer 14 has a film thickness extremely smaller than that of the second cover layer. No diffraction grating is formed between metal layer 41 and second cover layer 16.

In the present exemplary embodiment, second cover layer 16 and metal layer 41 constitute light generation means. In this light generation means, a Kretschmann configuration is realized. An ATR method is used, as in the second exemplary embodiment, to generate light from a surface plasmon. That is, when a surface plasmon is excited at first diffraction grating 21, the same surface plasmon as that at first diffraction grating 21 is induced at the interface between metal layer 41 and second cover layer 16. Light is emitted in second cover layer 16 from the surface plasmon through evanescent light generated at the interface between metal layer 41 and second cover layer 16. As a result, the same effect as that in the first exemplary embodiment is also obtained in the present exemplary embodiment.

[Fourth Exemplary Embodiment]

Figure 10:
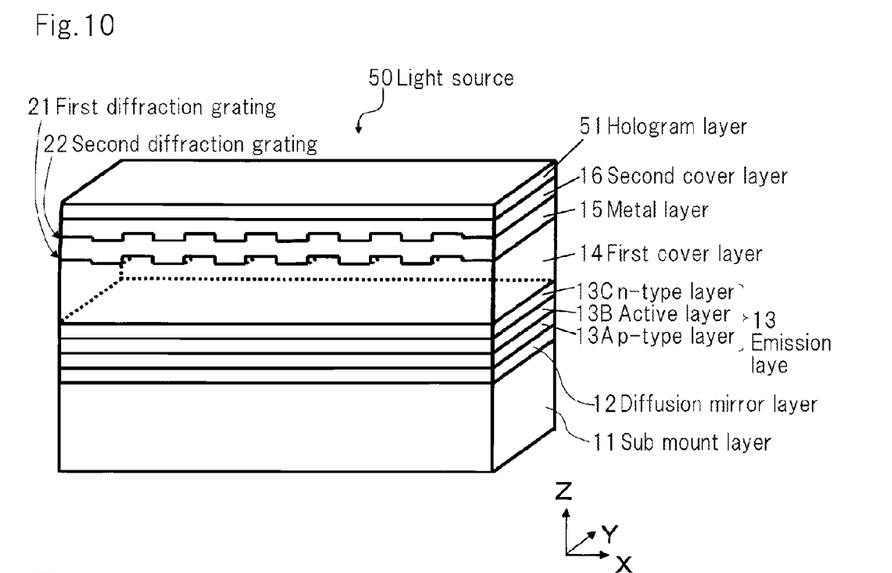
FIG. 10 is a perspective view showing a light source in a fourth exemplary embodiment of the present invention.

FIG. 10 is a perspective view schematically showing a light source in a fourth exemplary embodiment of the present invention. Light source 50 shown in FIG. 10 includes a modification of the construction on the exit side of second cover layer 16 in light source 10 shown in FIG. 1. More specifically, light source 50 differs from light source 10 in that hologram layer 51 is laid on second cover layer 16 in place of diffracting portion 23 of second cover layer 16.

Hologram layer 51 is a multi-hologram in which a plurality of holograms are stacked that diffract, uniformly in one direction, lights having a plurality of angles of incidence on hologram layer 51 due to a plurality of modes of a surface plasmon excited by diffracted light of second or higher order diffracted by first diffraction grating 21, and that send out the diffracted lights. Therefore, even when a surface plasmon is excited by diffracted light of a second or higher order diffracted by first diffraction grating 21, the increase in etendue of light source 50 can be limited.

While the present exemplary embodiment has been described with respect to a case where the construction on the exit side of second cover layer 16 in light source 10 in the first exemplary embodiment is modified, the construction on the exit side of second cover layer 16 in each of light sources 30 and 40 in the second and third exemplary embodiments may also be modified in the same way as in the present exemplary embodiment.

[Fifth Exemplary Embodiment]

Figure 11:
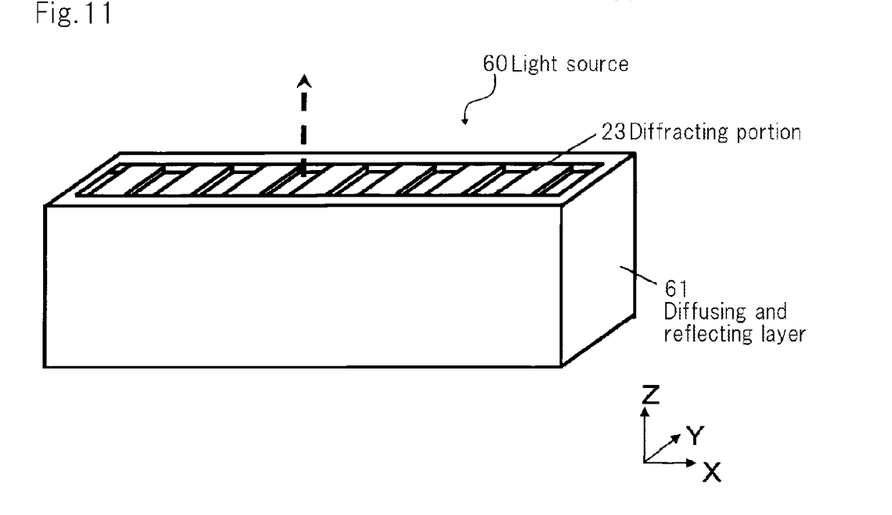
FIG. 11 is a perspective view showing a light source in a fifth exemplary embodiment of the present invention.

FIG. 11 is a perspective view schematically showing a light source in a fifth exemplary embodiment of the present invention. Light source 60 shown in FIG. 11 has reflecting part 61 added to light source 10 shown in FIG. 1 so as to cover outer wall surfaces (i.e., side surfaces of the light source) except the upper and lower surfaces that are light exit surfaces.

Reflecting part 61 reflects light generated in emission layer 13. Reflecting part 61 is capable of limiting exiting of light from the side surfaces of emission layer 13, thereby enabling light generated in emission layer 13 to enter metal layer 15 with efficiency in comparison with light source 10 shown in FIG. 1. As a result, randomly polarized light can be efficiently converted into TM-polarized light that exits.

While the provision of reflecting part 61 on the entire side surface of light source 60 has been described, reflecting part 61 may be provided on only part of the side surfaces. Also in such a case, light generated in emission layer 13 can enter metal layer 15 without being wasted. Reflecting part 61 may be a member that diffuses and reflects light.

While the present exemplary embodiment has been described with respect to a case where reflecting part 61 is added to light source 10 in the first exemplary embodiment, reflecting part 61 may also be added to each of light sources 30, 40, and 50 in the second to fourth exemplary embodiments.

[Sixth Exemplary Embodiment]

Figure 12:
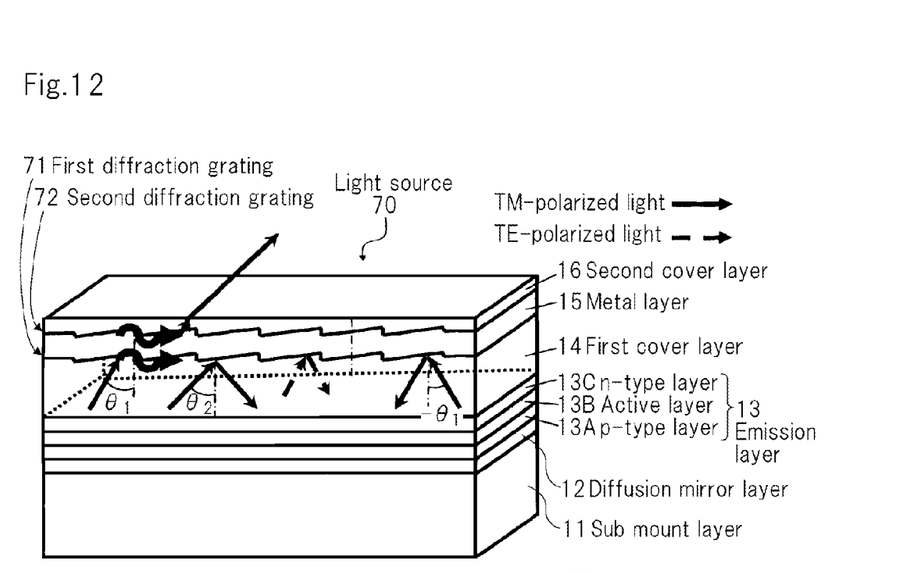
FIG. 12 is a perspective view showing a light source in a sixth exemplary embodiment of the present invention.

FIG. 12 is a perspective view schematically showing a light source in a sixth exemplary embodiment of the present invention. Light source 70 shown in FIG. 11 includes a modification of the construction of the diffraction grating in light source 10 shown in FIG. 1. More specifically, light source 70 differs from light source 10 shown in FIG. 1 in that first diffraction grating 71 and second diffraction grating 72 are provided in place of first diffraction grating 21 and second diffraction grating 22.

First diffraction grating 71 is a brazed diffraction grating. That is, first diffraction grating 71 is formed of a relief structure periodic in the X-direction. The relief structure has a sawtooth-like sectional shape as seen along the Y-direction. Second diffraction grating 72 has the same structure as that of first diffraction grating 71.

With the brazed diffraction grating, only one light of light incident at incidence angle θ and light incident at incidence angle −θ is diffracted according to the brazing direction. With first diffraction grating 71 in the present exemplary embodiment, only light incident at incidence angle θ1 among light incident at incidence angle θ1 and light incident at incidence angle −θ1 is diffracted. Therefore a surface plasmon is excited by only TM-polarized light incident on metal layer 15 at incidence angle θ1, so that the angle of emergence of emergent light exiting from second diffraction grating 72 is only θ1.

The incidence angle θ1 at which excitation of a surface plasmon at the interface with metal layer 15 can be changed by means of the dielectric constant of metal layer 15 and the pitch of first diffraction grating 71 and second diffraction grating 72 for example, are as described above. Therefore the angle θ1 of emergence of light exiting from second diffraction grating 72 can be set smaller than the angle of total reflection on second cover layer 16 by adjusting, for example, the dielectric constant and the pitch without providing diffracting portion 23 on second cover layer 16, thereby causing light to exit from light source 70 in a predetermined direction.

The projections of the first diffraction grating in the present embodiment, not limited to the sawtooth-like projections, may have any other shape, e.g., a stepped shape as long as they are asymmetrical about a line passing through the vertex of one of the projections and parallel to the Z-direction in a section perpendicular to the Y-direction.

[Seventh Exemplary Embodiment]

Figure 13:
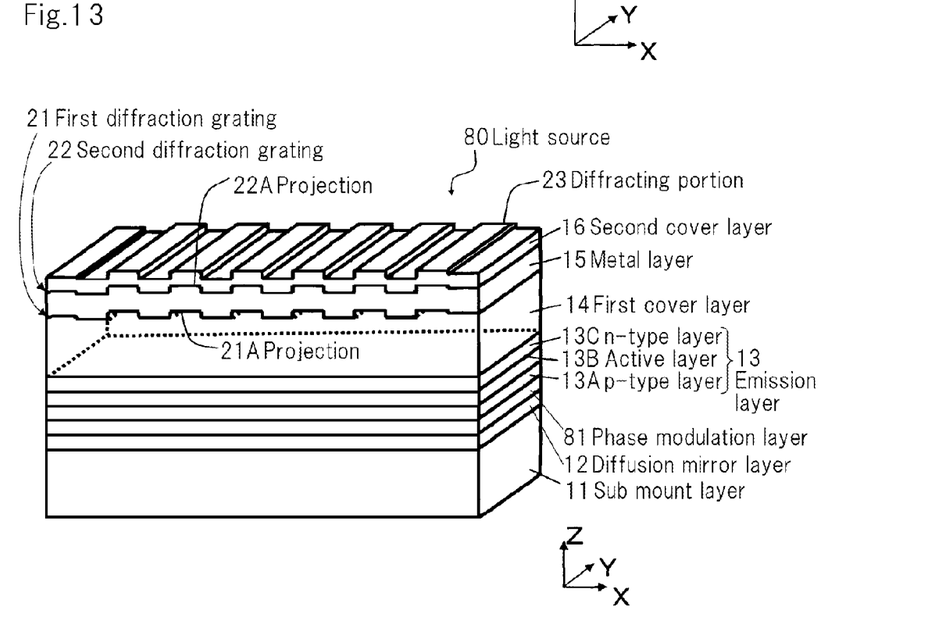
FIG. 13 is a perspective view showing a light source in a seventh exemplary embodiment of the present invention.

FIG. 13 is a perspective view schematically showing a light source in a seventh exemplary embodiment of the present invention. Light source 80 shown in FIG. 13 as phase modulation layer 81 inserted between diffusion mirror layer 12 and metal layer 15 in light source 10 shown in FIG. 1.

Phase modulation layer 81 phase-modulates light passing therethrough to change the state of polarization of the light. Phase modulation layer 81 is a phase difference plate, e.g., a λ/4 plate that gives a phase difference to light passing therethrough.

In the present exemplary embodiment, the polarization is changed with phase modulation plate 81, so that light generated in emission layer 13 can be changed into light for exciting a surface plasmon with efficiency in comparison with light source 10 shown in FIG. 1.

While the present exemplary embodiment has been described with respect to a case where phase modulation layer 81 is added to light source 10 in the first exemplary embodiment, phase modulation layer 81 may also be added to each of light sources 30, 40, 50, 60, and 70 in the second to sixth exemplary embodiments.

The construction illustrated with respect to each of the above-described embodiment is only an example. The present invention is not limited to the illustrated constructions.

This application is based upon and claims the benefit of priority form the prior Japanese Application No. 2010-187149, filed on Aug. 24, 2010; the entire contents of which are incorporated herein by reference.

What is claimed is:

1. A light source comprising:
an emission layer; and
a first transparent dielectric layer, a metal layer and a second transparent dielectric layer stacked in this order on said emission layer,
wherein a relief structure that functions as surface plasmon excitation means for exciting a surface plasmon by a particular polarization component, in a polarization direction perpendicular to a first direction coplanar with an interface between said metal layer and said first transparent dielectric layer, in light from said emission layer incident on the interface is formed at the interface, the relief structure being periodic in a second direction perpendicular to the first direction in the interface, respective projections of the relief structure being extended along the first direction, and
wherein light generation means for generating light having the same polarization component as the particular polarization component from the surface plasmon generated at the interface between said metal layer and said first transparent dielectric layer according to the surface plasmon excited by the particular polarization component through the surface plasmon excitation means is formed at an interface between said metal layer and said second transparent dielectric layer.

2. The light source according to claim 1, wherein the light generation means has the same structure as the surface plasmon excitation means at the interface between said second transparent dielectric layer and said metal layer, and said second transparent dielectric layer has the same dielectric constant as that of said first transparent dielectric layer.

3. The light source according to claim 1, wherein the light generation means includes a low-refractive-index layer inserted between said metal layer and said second transparent dielectric layer, said low-refractive-index layer having a refractive index smaller than that of said second transparent dielectric layer.

4. The light source according to claim 1, wherein the refractive index of said second transparent dielectric layer is smaller than that of said first transparent dielectric layer, and
wherein the film thickness of said metal layer is smaller than that of said second transparent dielectric layer.

5. The light source according to claim 1, wherein said metal layer includes Ag.

6. The light source according to claim 5, wherein the surface plasmon excitation means excites the surface plasmon by a particular polarization component of red light, and the period of the relief structure in the second direction is in a range from 0.2 to 4.2 μm.

7. The light source according to claim 5, wherein the surface plasmon excitation means excites the surface plasmon by a particular polarization component of green light, and the period of the relief structure in the second direction is in a range from 0.2 to 3.5 μm.

8. The light source according to claim 5, wherein the surface plasmon excitation means excites the surface plasmon by a particular polarization component of blue light, and the period of the relief structure in the second direction is in a range from 0.15 to 3.0 μm.

9. The light source according to claim 1 wherein said metal layer includes Au or Al.

10. The light source according to claim 1, wherein the projections of the relief structure are symmetrical about a line passing through the vertexes of the projections and are perpendicular to the second direction in a section perpendicular to the first direction.

11. The light source according to claim 10, wherein the section of the relief structure perpendicular to the first direction has the shape of rectangular waves.

12. The light source according to claim 10, wherein the section of the relief structure perpendicular to the first direction has the shape of stepped waves.

13. The light source according to claim 10, wherein the section of the relief structure perpendicular to the first direction has the shape of sinusoidal waves.

14. The light source according to claim 10, wherein the section of the relief structure perpendicular to the first direction has the shape of isosceles-triangle waves.

15. The light source according to claim 1, further comprising diffraction means for diffracting in a predetermined direction light propagating in said second transparent dielectric layer and sending out the diffracted light.

16. The light source according to claim 15, wherein the diffraction means is a plurality of structural members formed in a light exit surface of said second transparent dielectric layer through which the light exits, and
wherein the structural members are extended along the first direction and are periodically arranged along the second direction.

17. The light source according to claim 15, wherein the diffraction means is a hologram.

18. The light source according to claim 1, wherein the relief structure is asymmetrical about a line passing through the vertexes of the projections and perpendicular to the second direction in a section perpendicular to the first direction.

19. The light source according to claim 18, wherein the section of the relief structure of the surface plasmon excitation means perpendicular to the first direction has the shape of sawtooth waves.

20. The light source according to claim 18, wherein the section of the relief structure of the surface plasmon excitation means perpendicular to the first direction has the shape of stepped waves.

21. The light source according to claim 1, further comprising a reflecting layer provided on the side of said emission layer opposite from said first transparent dielectric layer.

22. The light source according to claim 21, wherein said reflecting layer is a diffusing reflecting layer that diffuses and reflects light.

23. The light source according to claim 21, further comprising a reflecting part provided on at least part of an outer wall surface except on a light exit surface through which light propagating in said second transparent dielectric layer exits.

24. The light source according to claim 21, further comprising a phase modulation layer inserted between said metal layer and said reflecting layer, said phase modulation layer changing the polarization of light passing therethrough.

25. The light source according to claim 24, wherein said phase modulation layer is a phase difference plate that gives a phase difference to light passing therethrough.

26. A projection-type display device comprising:
the light source according to claim 1;
a modulating element that modulates light from said light source according to a video signal and sends out the modulated light; and
a projection optical system that projects the light sent out from said modulating element.

* * * * *